United States Patent
Shang et al.

(10) Patent No.: US 11,676,642 B2
(45) Date of Patent: Jun. 13, 2023

(54) MEMORY FOR IMPLEMENTING AT LEAST ONE OF READING OR WRITING COMMAND

(71) Applicant: CHANGXIN MEMORY TECHNOLOGIES, INC., Anhui (CN)

(72) Inventors: Weibing Shang, Shanghai (CN); Fengqin Zhang, Shanghai (CN); Kangling Ji, Shanghai (CN); Kai Tian, Shanghai (CN); Xianjun Wu, Shanghai (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 50 days.

(21) Appl. No.: 17/405,107

(22) Filed: Aug. 18, 2021

(65) Prior Publication Data

US 2022/0059137 A1 Feb. 24, 2022

Related U.S. Application Data

(63) Continuation of application No. PCT/CN2021/100833, filed on Jun. 18, 2021.

(30) Foreign Application Priority Data

Aug. 21, 2020 (CN) .......................... 202010850618.2

(51) Int. Cl.
*G11C 5/06* (2006.01)
*G11C 5/14* (2006.01)
(Continued)

(52) U.S. Cl.
CPC .............. *G11C 5/063* (2013.01); *G11C 5/025* (2013.01); *G11C 5/14* (2013.01); *H01L 23/5286* (2013.01)

(58) Field of Classification Search
CPC ........... G11C 6/063; G11C 5/025; G11C 5/14; H01L 23/5286
(Continued)

(56) References Cited

U.S. PATENT DOCUMENTS 6,317,374 B2 11/2001 Feurle
6,636,453 B2 10/2003 Fischer
(Continued)

FOREIGN PATENT DOCUMENTS

| CN | 110176268 A | 8/2019 |
| CN | 210837190 U | 6/2020 |
| CN | 212303076 U | 1/2021 |

*Primary Examiner* — Huan Hoang
(74) *Attorney, Agent, or Firm* — Cooper Legal Group, LLC

(57) ABSTRACT

A memory, comprising: a plurality of storage groups, first signal lines and second signal lines. The plurality of storage groups is arranged along a first direction, each one of the storage groups includes multiple banks, which are arranged along a second direction, and the first direction is perpendicular to the second direction; the first signal lines extend along the first direction, each first signal line is arranged correspondingly to more than one of the multiple banks, and configured to transmit storage data of the more than one of the multiple banks; and the second signal lines extend along the first direction, each one of the second signal lines is arranged correspondingly to a respective bank, and configured to transmit the storage data of the respective bank; wherein the first signal lines exchange the storage data with the second signal lines through respective data exchange circuits.

12 Claims, 3 Drawing Sheets

(51) Int. Cl.
    *G11C 5/02*     (2006.01)
    *H01L 23/528*     (2006.01)

(58) Field of Classification Search
    USPC .......................................................... 365/63
    See application file for complete search history.

(56) References Cited

U.S. PATENT DOCUMENTS

| | | |
|---|---|---|
| 7,203,102 B2 | 4/2007 | Brox |
| 7,227,799 B2 | 6/2007 | Vogelsang |
| 7,808,853 B2 | 10/2010 | Berthel |
| 10,580,463 B2 | 3/2020 | Nishizaki |
| 2002/0163033 A1* | 11/2002 | Sugawara ................ G11C 7/18 |
| | | 257/315 |
| 2011/0096609 A1* | 4/2011 | Lee ................... H01L 27/11521 |
| | | 257/E27.06 |
| 2013/0279279 A1 | 10/2013 | Kim |
| 2015/0117091 A1* | 4/2015 | Maheshwari ......... G11C 11/419 |
| | | 365/230.03 |
| 2019/0259460 A1 | 8/2019 | Noro et al. |

\* cited by examiner

MEMORY FOR IMPLEMENTING AT LEAST ONE OF READING OR WRITING COMMAND

CROSS-REFERENCE TO RELATED APPLICATIONS

This application is a continuation of International Application No. PCT/CN2021/100833, filed on June 18, 2021, which is based upon and claims priority to Chinese Patent Application No. 202010850618.2, filed on Aug. 21, 2020 and entitled "Memory". The contents of International Application No. PCT/CN2021/100833 and Chinese Patent Application No. 202010850618.2 are incorporated herein by reference in their entireties.

TECHNICAL FIELD

The disclosure relates to a memory.

BACKGROUND

In a modern Dynamic Random Access Memory (DRAM) chip, wiring density is getting greater and greater with a gradually reduced size. Usually, a bonding pad region is arranged at one side of a wiring region or a middle region of a storage group.

SUMMARY

According to multiple embodiments, a first aspect of the embodiments of the disclosure provides a memory. The memory includes multiple storage groups, first signal lines, and second signal lines.

Multiple storage groups are arranged along a first direction. Each one of the storage groups includes multiple banks, the multiple banks are arranged along a second direction, and the first direction is perpendicular to the second direction.

The first signal lines extend along the first direction. Each one of the first signal lines is arranged correspondingly to more than one of the multiple banks, and is configured to transmit storage data of the more than one of the multiple banks.

The second signal lines extend along the first direction. Each one of the second signal lines is arranged correspondingly to a respective bank and is configured to transmit the storage data of the respective bank.

Herein, the first signal lines exchange the storage data with the second signal lines through respective data exchange circuits.

Details of one or more embodiments of this application will be given in the drawings and description below. Other features and advantages of this application will become apparent from the description, drawings and claims.

BRIEF DESCRIPTION OF THE DRAWINGS

To better clarity the technical solution of the embodiments of this application or the traditional technology, the drawings required to illustrate the embodiments or the traditional technology will be simply described blow. It is apparent that the drawings described below merely illustrate some embodiments of the application. Those ordinarily skilled in the art can obtain other drawings on the basis of those drawings without involving any inventive effort.

Reference signs: storage group—100, first storage group—100a, second storage group—100b, bank—110, first signal line—200, first metal line—210, second signal line—300, second metal line—310, data exchange circuit—400, power line—500, grounding line—600, channel data bus—700.

DETAILED DESCRIPTION

When a bonding pad region is arranged at one side of a wiring region or a middle region of a storage group, storage regions away from the bonding pad region will be affected. For example, when the signal line is the power line, pressure drop or ground bounce will be generated at a position away from the bonding pad region on the power line, thereby affecting the speed of the storage regions located at a far end of the signal line.

In order to make the above objectives, features, and advantages of the disclosure more obvious and understandable, the specific embodiments of the disclosure will be described in detail below in conjunction with the drawings. Numerous specific details are described in the following description in order to facilitate a thorough understanding of the disclosure. However, the disclosure can be implemented in many other modes different from those described herein. Those skilled in the art can make similar improvements without departing from the connotation of the disclosure. Therefore, the disclosure is not limited by the specific implementations disclosed hereinafter.

In addition, terms "first" and "second" are merely for description, instead of being understood as indicating or implying relative importance or impliedly indicating the quantity of the showed technical features. Thus, the features defined with "first" and "second" may expressly or impliedly one or more of the features. In the description of the disclosure, "a plurality of" means two or above two, unless specific limitation otherwise.

In the disclosure, unless specific regulation and limitation otherwise, terms "install", "join", "connect", "fix" and the like should be generally understood, for example, may be a fixed connection, or a detachable connection, or integrated, may be a mechanical connection or an electric connection or communication, may be a direct connection or an indirect connection through an intermediation, and may be an internal connection of two elements or an interactive relationship of two elements. Those of ordinary skilled in the art may understand the specific meaning of the terms in the disclosure according to specific conditions.

Figure 1:
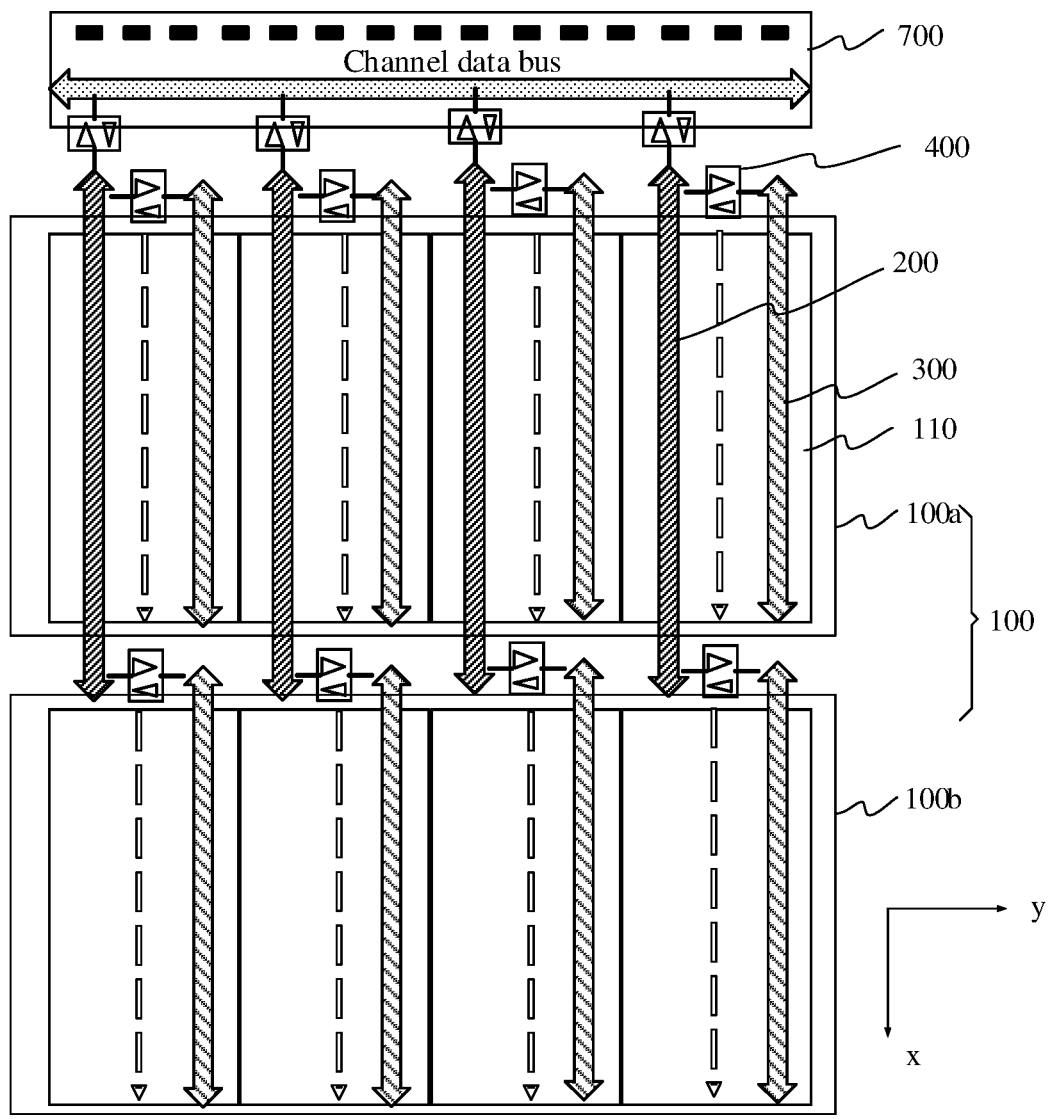
FIG. 1 is a schematic diagram of a wiring structure of a memory according to the disclosure.

Referring to FIG. 1, embodiments of the disclosure provide a memory. The memory includes multiple storage groups 100, first signal lines 200 and second signal lines 300.

Herein, multiple storage groups 100 are arranged along a first direction, each one of the storage groups 100 includes multiple banks 110, and multiple banks 110 are arranged along a second direction. The first direction x is perpendicular to the second direction y.

The first signal lines 200 extend along the first direction x. Each one of the first signal lines is arranged correspondingly to more than one of the multiple banks 110, and is configured to transmit storage data of more than one of the multiple banks.

The second signal lines 300 extend along the first direction x. Each one of the second signal lines is arranged correspondingly to a respective bank 110 and is configured to transmit the storage data of the respective bank 110. Herein, the first signal lines 200 exchange the storage data with the second signal lines 300 through respective data exchange circuits 400.

In the present embodiment, a first storage group 100*a* and a second storage group 100*b* that are arranged along the first direction x are included. Each storage group 100 includes four banks 110. Specifically, the first storage group 100*a* includes banks B0, B1, B2 and B3, and the second storage group 100*b* includes banks B4, B5, B6 and B7. The first direction x is a column direction, and the second direction y is a row direction. The first signal lines 200 are located above the first storage group 100*a,* and are global data buses. The second signal lines 300 are located above the first storage group 100*a* and the second storage group 100*b,* and are local data buses. During a storage process, the storage data is provided to the second signal lines 300 by the first signal lines 200 through the respective data exchange circuits 400, and then the storage data is provided to the respective banks 110 by the second signal lines 300, thereby implementing the transmission of the storage data.

It should be understood that, in the present embodiment, the storage data is transmitted to each bank 110 through a respective first signal line 200, and then the storage data is exchanged with the respective second signal line 300 through the data exchange circuit 400 corresponding to each bank 110. While implementing the transmission of the storage data of the corresponding bank 110, a transmission distance of the storage data on the second signal lines 300 may be reduced, the pressure drop and delay of the storage data on the second signal lines 300 are reduced, and then a circuit speed of the banks 110 at a far end is improved, and a speed difference between the banks 110 is reduced.

In an embodiment, the first signal lines 200 includes multiple first metal lines 210 with the same line width, and the second signal lines 300 include multiple second metal lines 310 with the same line width.

In the present embodiment, the first signal lines 200 include multiple first metal lines 210 along the first direction x, and the storage data is provided to different banks 110 through the multiple first metal lines 210. Moreover, compared with other signal lines formed by using non-metal, the first metal lines 210 have smaller resistance, so the pressure drop of the storage data on the first metal lines 210 may be reduced. Furthermore, when multiple first metal lines 210 have the same line width, it is beneficial to simplify a manufacturing process and reduce manufacturing cost. Similarly, multiple second metal lines 310 with the same line width extend along the first direction x, so that the storage data is provided to the storage region. At this case, the pressure drop and delay of the storage data on the second signal lines 300 are reduced, and the circuit speed of the storage region is improved.

Furthermore, the number of the first metal lines 210 in each first signal line 200 is the same as the number of the second metal lines 310 in each second signal line 300. For example, the number is 128 or 256.

In an embodiment, the line width of the first metal lines 210 is less than the line width of the second metal lines 310.

Figure 2:
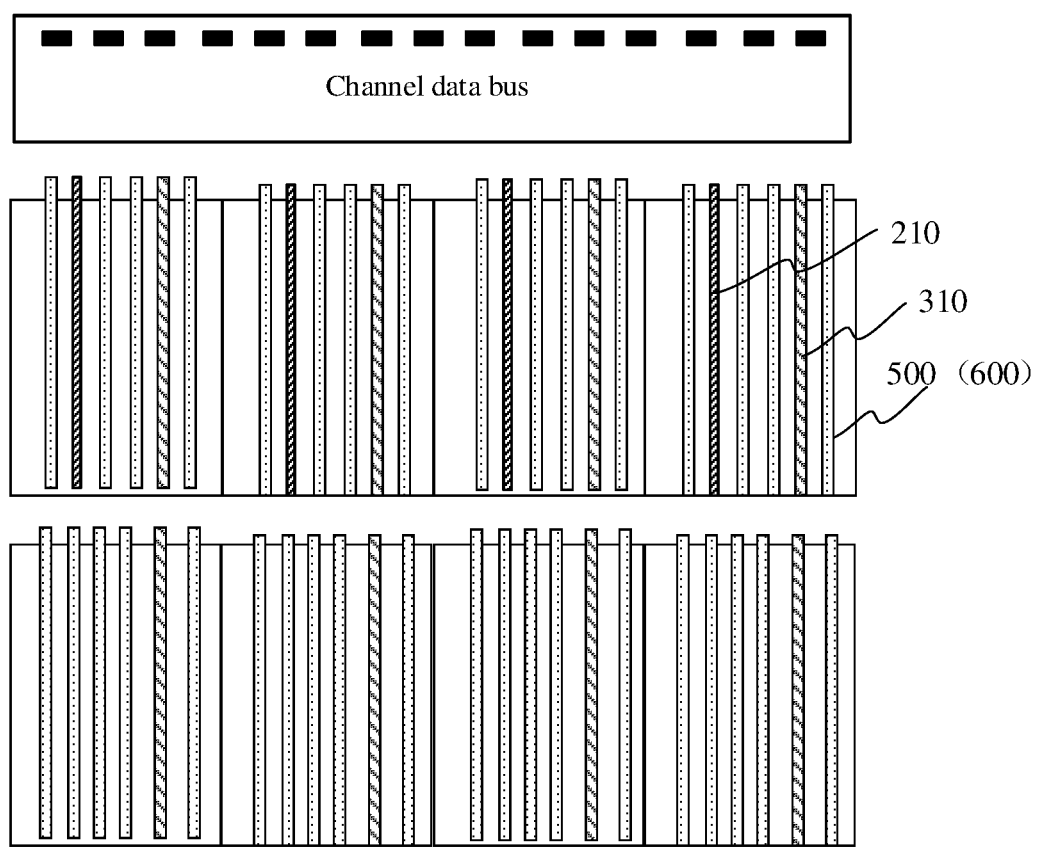
FIG. 2 is a schematic diagram of a wiring structure of another memory according to the disclosure.

In an embodiment, as illustrated in FIG. 2, during actual wiring, each bank 110 is divided into a left half-bank and a right half-bank along the first direction x. In order to reduce a coupling action among signals, each first signal line 200 is arranged above the respective left half-bank, and each second signal line 300 is arranged above the respective right half-bank. The line width of the first metal lines 210 is around 0.25 micrometers, and the line width of the second metal lines 310 is around 0.5 micrometers.

It should be understood that, in the embodiment, the storage data is transmitted to the data exchange circuit 400 of each bank 110 through the respective first signal line 200, and then the storage data is obtained from the data exchange circuit 400 through the respective second signal line 300 and provided to the storage region, thus the pressure drop and delay on the second signal lines 300 are the main factors affecting the speed of the storage region. Therefore, in the embodiment, the line width of the second signal lines 300 may be properly increased, so that the speed influence of the pressure drop, parasitic resistance and the like on the second signal lines 300 on the storage region will be reduced, and the banks 110 have the similar speed performance In an embodiment, the distance between two of the first metal lines 210 is greater than the distance between two of the second metal lines 310.

It should be understood that, in the current wiring process, wiring is performed according to four times or twice or one time of metal line width. When the line width of the first metal lines 210 is less than the line width of the second metal lines 310, correspondingly, the distance between two adjacent first metal lines 210 is greater than the distance between two adjacent second metal lines 310. Moreover, the greater the distance between two adjacent first metal lines 210, the smaller of the coupling capacitance between the two adjacent first metal lines 210, so that the power consumption of the first metal lines 210 may be reduced. In the embodiment, the distance of two adjacent first metal lines 210 is about 0.75 micrometers, and the distance of two adjacent second metal lines 310 is about 0.5 micrometers.

Furthermore, in the embodiment, the storage data is transmitted to the data exchange circuit 400 of each bank 110 through the respective first signal line 200, and then the storage data is obtained from the data exchange circuit 400 through the respective second signal line and provided to the storage region, so that the first signal lines 200 only need to extend from the above of the first storage groups 100 to the edge of the second storage group 100*b,* there is no first signal lines 200 above the second storage group 100*b.* The wiring region of the second signal lines 300 above the second storage group 100*b* is increased. Therefore, the distance of the second metal lines 310 located above the second storage group 110*b* may be correspondingly increased, so that the coupling capacitance between the second metal lines 310 will be reduced, the power consumption of the second metal lines 310 is reduced, so as to ensure that the storage groups 100 away from the bonding pad region and the storage groups 100 closing to the bonding pad region have the similar speed performance. In the embodiment, in the second signal lines 300 corresponding to the second storage group 100*b,* the distance between the second metal lines 310 is about 0.75 micrometers, and the coupling capacitance of the second metal lines 310 is reduced by about 15% compared with the second metal lines 310 with 0.5 micrometers of distance.

In an embodiment, the memory further includes power lines 500 and grounding lines 600. The power lines 500 or the grounding lines 600 are arranged at two sides of the respective first signal lines 200, and the power lines 500 or the grounding lines 600 are arranged at two sides of the respective second signal lines 300.

It should be understood that, apart from arranging the first signal lines 200 and the second signal lines 300 to transmit the storage data in the memory, the power lines 500 and grounding lines 600 for driving signals for the memory need to be arranged so as to drive transistors in the storage region. Noise may be shielded by using the power lines 500 and the grounding lines 600.

In the embodiment, the power lines 500 are arranged at two sides of the first signal lines 200 and the second signal lines 300. The line width of the power lines 500 is the same as the line width of the second metal lines 310, so that the second metal lines 310 and the power lines 500 may be manufactured and formed through a same mask while wiring. Furthermore, the line width of the power lines 500 may be set according to needs. In another embodiment, the grounding lines 600 are arranged at two sides of the first signal lines 200 and two sides of the second signal lines 300. When the power lines 500 or the grounding lines 600 are arranged at two sides of the first signal lines 200 and two sides of the second signal lines 300, it is beneficial to simplify a wiring process.

In a embodiment, the memory further includes a top metal layer (not illustrated in the figures). The first signal lines 200, the second signal lines 300, the power lines 500 and the grounding lines 600 are arranged in the top metal layer.

It should be understood that the power consumption and heat of the power lines 500 are greater when the voltage goes further along the power lines 500, so the memory may be damaged due to a high temperature. In addition, each metal layers has different resistivity. Usually, the lower metal layer has higher resistivity relative to the upper metal layer, so power transmitted on the power lines 500 located in the lower metal layer is more sensitive to consumption compared with power transmitted on the power lines 500 located in the upper metal layer. For example, the memory includes four wiring layers M1-M4 arranged from bottom to top, and the top metal layer (namely, M4 layer) has smaller resistivity. Therefore, in the embodiment, the first signal lines 200 and the second signal lines 300 are arranged in the top metal layer to ensure the quality of the storage data. Furthermore, after the first signal lines 200 and the second signal lines 300 are arranged, remaining spaces may be used for arranging the power lines 500 and the grounding lines 600 so as to reduce the energy consumption of the power lines 500. At the same time, radiation is conveniently performed to reduce the collection of heat in the memory.

In an embodiment, the memory further includes a sub-top metal layer (not illustrated in the figures), the power lines 500 or the grounding lines 600 are also arranged in the sub-top metal layer, and the power lines 500 or the grounding lines 600 are arranged in the sub-top metal layer along the first direction x and the second direction y.

It should be understood that as the memory size decreases, the wiring space also decreases, and the space of the top metal layer cannot meet the needs of the power lines 500 and the grounding lines 600. In order to solve this problem, in the present embodiment, the power lines 500 or the grounding lines 600 are arranged in a sub-top metal layer. The sub-top metal layer is a M3 metal layer, and has lower resistivity, so the sub-top metal layer is usually used for arranging the power lines 500 and the grounding lines 600 to solve the energy consumption and radiation problems of the power lines 500 and the grounding lines 600.

Figure 3:
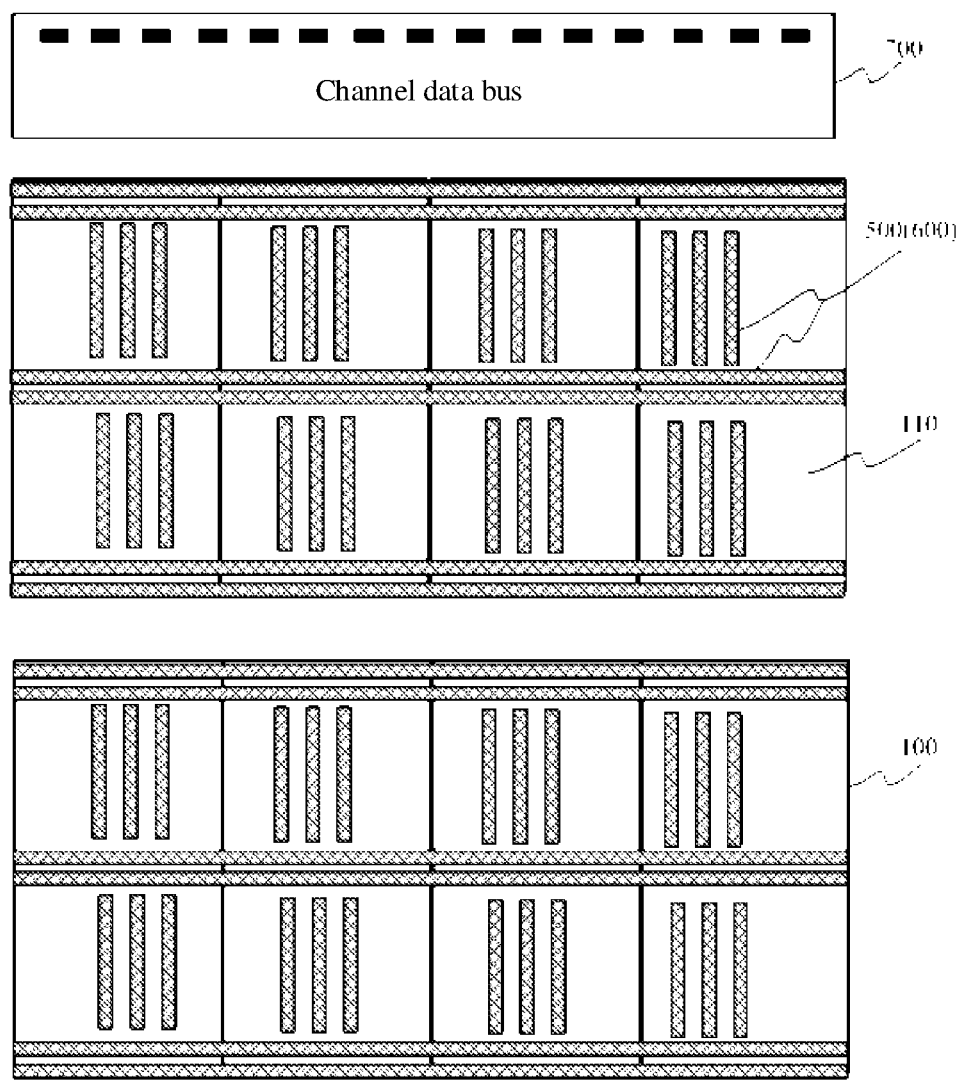
FIG. 3 is a schematic diagram of a wiring structure of another memory according to the disclosure.

As illustrated in FIG. 3, in the embodiment, the power lines 500 or the grounding lines 600 are arranged along the first direction x and the second direction y in the sub-top metal layer. Therefore, the power lines 500 or the grounding lines 600 may be freely combined according to an implementing position to determine a best transmission path, so as to reduce the pressure drop on the power lines 500.

In an embodiment, in the sub-top metal layer, the power lines 500 or the grounding lines 600 arranged along the second direction y are located right above the storage group 100, and located in the middle and the edges parallel to the second direction y of the storage group 100.

In the embodiment, the power lines 500 or the grounding lines 600 arranged along the second direction y are located right above the storage group 100. The power lines 500 or the grounding lines 600 arranged along the first direction x may be completely projected to the storage group 100 or partially projected to the storage group 100. Furthermore, the projection of the power lines 500 or the grounding lines 600 arranged along the second direction y may not be overlapped with the storage group 100. Still referring to FIG. 3, for example, a power near end is at a top left corner, a farthest end is at a lower right corner. Thus, during a power output process, multiple power lines 500 arranged along the first direction x and multiple power lines 500 arranged along the second direction y may be selected as a combined path to convey voltage to the farthest end, so as to reduce the pressure drop and power consumption of the combined path as far as possible.

In an embodiment, referring to FIG. 3, the power lines 500 arranged along the first direction x are located between the power lines 500 arranged along the second direction y, or the grounding lines 600 arranged along the first direction x are located between the grounding lines 600 arranged along the second direction y.

In the embodiment, the power lines 500 (or grounding lines 600) arranged along the first direction x are located right above the storage group 100 or a region between two adjacent storage groups 100. The power lines 500 arranged along the second direction y are located right above two ends of the storage group 100, and the power lines 500 (or grounding lines 600) arranged along the first direction x are arranged in an H-shape.

In an embodiment, the memory further includes a channel data bus 700, which exchanges the storage data with the first signal lines 200 through the data exchange circuit 400.

It should be understood that the memory may be roughly configured to implement a reading and/or writing command received from an external device. The storage data in the banks 110 are provided to the external device through the channel data bus 700 according to the reading command The storage data is received from the external device through the channel data bus 700 according to the writing command, and the storage data is stored in the banks 110.

In an embodiment, the channel data bus 700 is arranged away from one side of the storage group 100. It should be understood that the 700 is arranged away from one side of the storage group 100, so that the quantity of the signal lines and the quantity of connected PAD may be reduced, and the difficulty of a design circuit is reduced.

In an embodiment, the number of the storage groups 100 is n, the number of the second signal lines 300 is m times of the number of the first signal lines 200, and m and n are positive integers.

In the embodiment, the memory includes two storage groups 100 arranged along the first direction x, and provides the storage data to the second signal lines 300 through the first signal lines. Therefore, the first signal lines 200 are only arranged above the storage group 100 closing to the channel data bus 700. For another example, assuming that the memory includes four storage groups 100 arranged along the first direction x, the banks 110 located on the same column may share a first signal line 200 to realize electric connection with the channel data bus 700, and then each bank 110 transmits the storage data by the corresponding second signal line through the respective data exchange circuit 400. That is, the number of the second signal lines 300 in the memory is twice of the number of the first signal lines 200.

In conclusion, the embodiments of the disclosure provide a memory, which includes storage groups 100, first signal lines 200 and second signal lines 300. Multiple storage groups 100 are arranged along the first direction x. The storage groups 100 include banks 110. Multiple banks 110 are arranged along the second direction y, and the first direction x is perpendicular to the second direction y. The first signal lines 200 extend along the first direction x, and each first line is arranged correspondingly to multiple banks 110 and configured to transmit the storage data of the multiple banks 110. The second signal lines 300 extend along the first direction x, and are arranged correspondingly to the banks 110 one by one, and each second signal line is configured to transmit the storage data of a corresponding bank 110. Herein, each the first signal line 200 exchange the storage data with the respective second signal lines 300 through the respective data exchange circuits 400. In the disclosure, the storage data is transmitted to each bank 110 by arranging the respective first signal line 200, and then the storage data is exchanged with the respective second signal line 300 through the data exchange circuit 400 corresponding to each bank 110, so the transmission of the storage data of the corresponding bank 110 is implemented. At this case, the transmission distance of the storage data on the second signal lines 300 is reduced, the pressure drop and delay of the storage data on the second signal lines 300 are reduced, and then the speed difference between the banks 110 is reduced.

Each technical feature of the abovementioned embodiments may be combined freely. For simplicity of description, not all possible combinations of each technical solution in the abovementioned embodiments are described. However, any combination of these technical features shall fall within the scope recorded in the description without conflicting.

The abovementioned embodiments only express some implementation modes of the disclosure and are specifically described in detail and not thus understood as limits to the patent scope of the disclosure. It should be understood that those of ordinary skilled in the art may further make multiple transformations and improvements without departing from the concept of the disclosure and all of these shall fall within the protection scope of the disclosure. Therefore, the patent protection scope of the disclosure should be subject to the appended claims.

The invention claimed is:

1. A memory, comprising:
    a plurality of storage groups, wherein the plurality of storage groups are arranged along a first direction, each one of the plurality of storage groups comprises a plurality of banks, the plurality of banks are arranged along a second direction, and the first direction is perpendicular to the second direction;
    first signal lines extending along the first direction; wherein each one of the first signal lines is arranged correspondingly to more than one of the plurality of banks and is configured to transmit storage data of the more than one of the plurality of banks;
    second signal lines extending along the first direction, each one of the second signal lines being arranged correspondingly to a respective bank and configured to transmit storage data of the respective bank;
    wherein the first signal lines exchange the storage data with the second signal lines through respective data exchange circuits; and
    power lines and grounding lines, wherein the power lines or the grounding lines are arranged at two sides of the first signal lines, and the power lines or the grounding lines are arranged at two sides of the second signal lines.

2. The memory of claim 1, wherein the first signal lines comprise a plurality of first metal lines with a same line width, and the second signal lines comprise a plurality of second metal lines with a same line width.

3. The memory of claim 2, wherein the plurality of first metal lines have a line width less than a line width of the plurality of second metal lines.

4. The memory of claim 2, wherein a distance between two of the plurality of first metal lines is greater than a distance between two of the plurality of second metal lines.

5. The memory of claim 1, wherein the memory further comprises a top metal layer; and the first signal lines, the second signal lines, the power lines and the grounding lines are arranged in the top metal layer.

6. The memory of claim 5, wherein the memory further comprises a sub-top metal layer, wherein the power lines or the grounding lines are also arranged in the sub-top metal layer, and the power lines or the grounding lines are arranged along the first direction and the second direction in the sub-top metal layer.

7. The memory of claim 6, wherein in the sub-top metal layer, the power lines or the grounding lines arranged along the second direction are located right above the plurality of storage groups, and located in middle and two edges parallel to the second direction of the plurality of storage groups.

8. The memory of claim 7, wherein each one of the power lines arranged along the first direction is located between corresponding power lines arranged along the second direction, or each one of the grounding lines arranged along the first direction is located between corresponding grounding lines arranged along the second direction.

9. The memory of claim 1, wherein the memory further comprises a channel data bus, which exchanges the storage data with the first signal lines through the data exchange circuits.

10. The memory of claim 9, wherein the channel data bus is arranged away from one side of the plurality of storage groups.

11. The memory of claim 1, wherein a number of the plurality of storage groups is n, a number of the second signal lines is m times of a number of the first signal lines, and m and n are positive integers.

12. A memory, comprising:
    a plurality of storage groups, wherein the plurality of storage groups are arranged along a first direction, each one of the plurality of storage groups comprises a plurality of banks, the plurality of banks are arranged along a second direction, and the first direction is perpendicular to the second direction;
    first signal lines extending along the first direction; wherein each one of the first signal lines is arranged correspondingly to more than one of the plurality of banks and is configured to transmit storage data of the more than one of the plurality of banks;

second signal lines extending along the first direction, each one of the second signal lines being arranged correspondingly to a respective bank and configured to transmit storage data of the respective bank;

wherein the first signal lines exchange the storage data with the second signal lines through respective data exchange circuits;

the first signal lines comprise a plurality of first metal lines with a same line width, and the second signal lines comprise a plurality of second metal lines with a same line width; and the plurality of first metal lines have a line width less than a line width of the plurality of second metal lines.

* * * * *